United States Patent
Chen et al.

(10) Patent No.: US 12,107,190 B2
(45) Date of Patent: Oct. 1, 2024

(54) MICRO LIGHT-EMITTING DIODE AND DISPLAY PANEL

(71) Applicant: PlayNitride Display Co., Ltd., MiaoLi County (TW)

(72) Inventors: Jian-Zhi Chen, MiaoLi County (TW); Pai-Yang Tsai, MiaoLi County (TW); Fei-Hong Chen, MiaoLi County (TW); Yen-Chun Tseng, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 444 days.

(21) Appl. No.: 17/472,689

(22) Filed: Sep. 12, 2021

(65) Prior Publication Data
US 2022/0246799 A1   Aug. 4, 2022

(30) Foreign Application Priority Data

Jan. 29, 2021 (TW) ................................ 110103382
Apr. 23, 2021 (TW) ................................ 110114681

(51) Int. Cl.
*H01L 33/38* (2010.01)
*H01L 25/075* (2006.01)

(52) U.S. Cl.
CPC ........ *H01L 33/382* (2013.01); *H01L 25/0753* (2013.01)

(58) Field of Classification Search
CPC ....... H01L 33/382; H01L 33/62; H01L 33/22; H01L 33/44; H01L 27/156; H01L 2933/0016; H01L 2933/0025
See application file for complete search history.

(56) References Cited

U.S. PATENT DOCUMENTS 9,368,683 B1   6/2016 Meitl et al.
9,583,466 B2   2/2017 McGroddy et al.
(Continued)

FOREIGN PATENT DOCUMENTS

CN   105845801   8/2016
CN   108807612   11/2018
(Continued)

OTHER PUBLICATIONS

"Office Action of China Related Application, Application No. 202110126252.9", issued on Dec. 12, 2022, p. 1-p. 7.
(Continued)

*Primary Examiner* — Kyoung Lee
*Assistant Examiner* — Christina A Sylvia
(74) *Attorney, Agent, or Firm* — JCIPRNET

(57) ABSTRACT

A micro light-emitting diode including an epitaxy structure, a first pad, a first ohmic contact layer and a current conducting layer is provided. The epitaxy structure includes a first type semiconductor layer, a second type semiconductor layer and an active layer. The first pad is electrically connected to the first type semiconductor layer. The first ohmic contact layer is electrically connected between the first type semiconductor layer and the first pad. The current conducting layer is electrically connected between the first ohmic contact layer and the first pad. At least a portion of the orthogonal projection of the first ohmic contact layer on the plane upon which the first type semiconductor layer is located is away from the orthogonal projection of the first pad on the plane. A display panel is also provided.

14 Claims, 4 Drawing Sheets

(56) References Cited

U.S. PATENT DOCUMENTS

| | | | |
|---|---|---|---|
| 9,673,366 | B2 | 6/2017 | Hwang et al. |
| 10,217,403 | B2 | 2/2019 | Lin et al. |
| 10,763,389 | B1 | 9/2020 | Thompson |
| 2004/0147094 | A1 | 7/2004 | Haberern et al. |
| 2005/0104080 | A1 | 5/2005 | Ichihara et al. |
| 2008/0142810 | A1 | 6/2008 | Tompa et al. |
| 2011/0049572 | A1 | 3/2011 | Jeon et al. |
| 2011/0057234 | A1 | 3/2011 | Jeon et al. |
| 2012/0074441 | A1* | 3/2012 | Seo .................. H01L 33/42 257/E33.068 |
| 2016/0336484 | A1 | 11/2016 | McGroddy et al. |
| 2016/0343772 | A1 | 11/2016 | Bower et al. |
| 2018/0145224 | A1* | 5/2018 | Kim .................. H01L 33/0075 |
| 2018/0269635 | A1 | 9/2018 | Uchino et al. |
| 2020/0220046 | A1* | 7/2020 | Inazu .................. H01L 33/32 |
| 2020/0395506 | A1 | 12/2020 | Inazu et al. |
| 2021/0057609 | A1* | 2/2021 | Niwa .................. H01L 33/385 |

FOREIGN PATENT DOCUMENTS

| | | |
|---|---|---|
| CN | 109244204 | 1/2019 |
| CN | 110739378 | 1/2020 |
| CN | 111524925 | 8/2020 |
| CN | 211604646 | 9/2020 |
| EP | 2816619 | 12/2014 |
| JP | 2001168381 | 6/2001 |
| JP | 2007080899 | 3/2007 |
| JP | 2015070079 | 4/2015 |
| JP | 2018032798 | 3/2018 |
| TW | 202101788 | 1/2021 |
| WO | 2019148103 | 8/2019 |

OTHER PUBLICATIONS

"Office Action of China Counterpart Application", issued on Aug. 1, 2022, p. 1-p. 8.

"Office Action of Taiwan Counterpart Application", issued on Sep. 10, 2021, p. 1-p. 3.

"Notice of allowance of China Counterpart Application, Application No. 202110126252.9", issued on Aug. 1, 2023, p. 1-p. 3.

"Office Action of U.S. Related Application, U.S. Appl. No. 17/211,845 ", issued on Nov. 9, 2023, p. 1-p. 24.

"Office Action of U.S. Related Application, U.S. Appl. No. 17/211,845", issued on Mar. 30, 2023, p. 1-p. 23.

"Office Action of Taiwan Counterpart Application", issued on Oct. 15, 2021, p. 1-p. 6.

\* cited by examiner

MICRO LIGHT-EMITTING DIODE AND DISPLAY PANEL

CROSS-REFERENCE TO RELATED APPLICATION

This application claims the priority benefit of Taiwan application serial no. 110114681, filed on Apr. 23, 2021, and Taiwan application serial no. 110103382, filed on Jan. 29, 2021. The entirety of each of the above-mentioned patent applications is hereby incorporated by reference herein and made a part of this specification.

BACKGROUND

Technical Field

The disclosure relates to a light-emitting device and a display panel including the light-emitting device, and particularly relates to a micro light-emitting diode and a display panel including the micro light-emitting diode.

Description of Related Art

The light-emitting efficiency of a micro light-emitting diode (LED) chip is related to the internal quantum efficiency and the external light extraction efficiency thereof. The internal quantum efficiency of the micro LED chip is related to the epitaxy quality and the electrode design of the chip, whereas the external light extraction efficiency of the micro LED chip is related to the substrate design (e.g., a patterned substrate, a roughened substrate, etc.) and the optical device design (e.g., a light-emitting surface structure, a reflector, and a lens element, etc.) outside the chip. Taking the electrode design of the micro LED chip as an example, if an electrode is damaged during the manufacturing process, the light-emitting efficiency (i.e., the internal quantum efficiency) of the micro LED chip is reduced. Therefore, the electrode design of a micro LED chip has emerged as one of the key issues for facilitating light-emitting efficiency.

In the conventional electrode design, an ohmic contact layer is disposed below a conductive pad. With such design, the ohmic contact layer may be damaged when an insulating layer is being etched. As a result, the light-emitting efficiency of the micro LED chip is affected. Due to the size and the position of the conductive pad, the position of the ohmic contact layer is also limited.

SUMMARY

The disclosure provides a micro light-emitting diode (LED) and a display panel having the micro LED. The micro LED is provided with a current conducting layer disposed between the conductive pad and the ohmic contact layer.

According to an embodiment of the disclosure, a micro light-emitting diode including an epitaxy structure, a first pad, a first ohmic contact layer and a current conducting layer is provided. The epitaxy structure includes a first type semiconductor layer, a second type semiconductor layer, and an active layer disposed between the first type semiconductor layer and the second type semiconductor layer. The first pad is electrically connected to the first type semiconductor layer. The first ohmic contact layer is electrically connected between the first type semiconductor layer and the first pad. The current conducting layer is electrically connected between the first ohmic contact layer and the first pad. The orthogonal projection of the first ohmic contact layer on the plane on which the first type semiconductor layer is located and the orthogonal projection of the first pad on the plane on which the first type semiconductor layer is located are misaligned with each other.

An embodiment of the disclosure provides a display panel. The display panel includes a plurality of pixel units arranged into an array. Each of the pixel units includes the micro LED.

Based on the above, the micro LED is provided with the current conducting layer disposed between the conductive pad and the ohmic contact layer. Since the current conducting layer serves as an etching protection layer for the ohmic contact layer, the electrode of the micro LED is prevented from being damaged during a manufacturing process to reduce the contact resistance value. Therefore, the light-emitting efficiency is increased. The conductive pad and the ohmic contact layer are misaligned with each other. Therefore, the position where the ohmic contact layer is disposed is not limited by the size and the position of the conductive pad. As a result, the degree of freedom for setting the position is high. The ohmic contact layer may stay away from the sidewall of the active layer to reduce the chance of electron-hole combination on the sidewall of the active layer. Since the degree of freedom for setting the position of the ohmic contact layer is increased, the distance between the ohmic contact layer of the P-type semiconductor layer and the ohmic contact layer of the N-type semiconductor layer is reduced, and a forward bias is also reduced. The display panel according to an embodiment of the disclosure includes the micro LED having a low contact resistance value and a high light-emitting efficiency.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
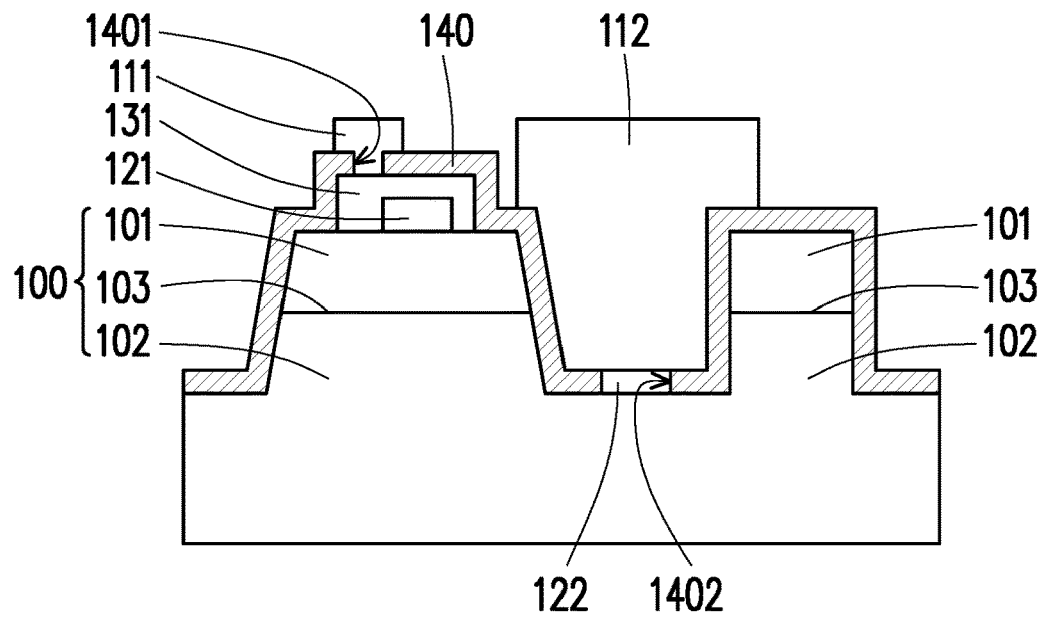
FIGS. 1 to 6 are schematic cross-sectional views illustrating micro light-emitting diodes (LEDs) according to first to sixth embodiments of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Referring to FIG. 1, FIG. 1 illustrates a micro light-emitting diode (LED) according to a first embodiment of the disclosure. A micro LED 1 includes an epitaxy structure 100, a first pad 111, a first ohmic contact layer 121, and a current conducting layer 131. The epitaxy structure 100 includes a first type semiconductor layer 101, a second type semiconductor layer 102, and an active layer 103 disposed between the first type semiconductor layer 101 and the second type semiconductor layer 102. The first pad 111 is electrically connected to the first type semiconductor layer 101. The first ohmic contact layer 121 is electrically connected between the first type semiconductor layer 101 and the first pad 111. The current conducting layer 131 is electrically connected between the first ohmic contact layer 121 and the first pad 111. At least a portion of the orthogonal projection of the first ohmic contact layer 121 on the plane on which the first type semiconductor layer 101 is located is away from the orthogonal projection of the first pad 111 on the plane on which the first type semiconductor layer 101 is located.

In the embodiment, the micro LED 1 further includes an insulating layer 140, a second pad 112, and a second ohmic contact layer 122. The current conducting layer 131 is disposed between the first ohmic contact layer 121 and the first pad 111. The first pad 111 is connected to the current conducting layer 131 via a first through hole 1401 of the insulating layer 140 to be electrically connected to the first ohmic contact layer 121 and the first type semiconductor layer 101. The second pad 112 is connected to the second ohmic contact layer 122 disposed in a second through hole 1402 of the insulating layer 140 to be electrically connected to the second type semiconductor layer 102. In the embodiment, the insulating layer 140 is partially disposed on the sidewall of the second type semiconductor layer 102 and aligned with the second type semiconductor layer 102. Accordingly, when the micro LED 1 is manufactured on a wafer (not shown), the micro LED 1 may be arranged more densely. Thus, the usage efficiency of the micro LED 1 is facilitated.

Specifically, compared with the conventional art, the micro LED 1 according to the embodiment of the disclosure is provided with the current conducting layer 131. The current conducting layer 131 is electrically connected between the first ohmic contact layer 121 and the first pad 111. Thus, the first ohmic contact layer 121 is not required to be disposed directly under the first pad 111. When the insulating layer 140 is etched to generate the first through hole 1401, the current conducting layer 131 may serve as an etching protection layer of the first ohmic contact layer 121. Accordingly, the first ohmic contact layer 121 of the micro LED 1 is prevented from being damaged in the manufacturing process. Hence, the contact resistance value may be reduced, and the light-emitting efficiency of the micro LED 1 may be facilitated. Moreover, at least a portion of the orthogonal projection of the first ohmic contact layer 121 on the plane on which the first type semiconductor layer 101 is located is away from the orthogonal projection of the first pad 111 on the plane on which the first type semiconductor layer 101 is located. In other words, the orthogonal projection of the first pad 111 is not completely overlapped with the orthogonal projection of the first ohmic contact layer 121, and the first pad 111 and the first ohmic contact layer 121 are misaligned (i.e., the first ohmic contact layer 121 is not required to be disposed directly under the first pad 111). Thus, the position where the first ohmic contact layer 121 is disposed is not limited by the size and the position of the first pad 111, and the degree of freedom for setting the position of the first ohmic contact layer 121 is increased. Therefore, the first ohmic contact layer 121 may be disposed at a position away from the first type semiconductor layer 101 and the sidewall of the active layer 103, so as to reduce the chance of electron-hole combination on the sidewall of the active layer 103. Moreover, since the degree of freedom for setting the position of the first ohmic contact layer 121 is increased, a suitable setting position may be chosen. As a result, the distance between the first ohmic contact layer 121 and the second ohmic contact layer 122 is reduced, and a forward bias is consequently reduced.

In the embodiment shown in FIG. 1, the orthogonal projection of the first ohmic contact layer 121 on the plane on which the first type semiconductor layer 101 is located is located between the orthogonal projection of the second pad 112 and the orthogonal projection of the first pad 111.

In the embodiment, the current conducting layer 131 is a non-metal transparent conductive layer. The material of the current conducting layer 131 includes, for example, at least one of indium tin oxide (no), indium zinc oxide (IZO), aluminum-doped zinc oxide (AZO), aluminum-doped indium oxide (AIO), indium oxide (InO), gallium oxide (GaO), and indium gallium zinc oxide (IGZO). The resistance value of the current conducting layer 131 is greater than the resistance values of the first pad 111 and the first ohmic contact layer 121. By using a non-metal transparent conductive layer as the current conducting layer 131, light absorption may be avoided. In addition, due to the non-metallic property of the current conducting layer 131, the characteristics (e.g., thermal expansion coefficient) thereof is close to the insulating layer 140 that is also non-metallic. Thus, a favorable bonding force is provided between the current conducting layer 131 and the insulating layer 140, and a low stress difference is present between the current conducting layer 131 and the insulating layer 140. The current conducting layer 131 of the embodiment contacts the first type semiconductor layer 101 and at least partially encapsulates the first ohmic contact layer 121. Therefore, the current conducting layer 131 has a large contact area with the first ohmic contact layer 121, thereby increasing the current conducting efficiency. The resistance rate of the current conducting layer 131 is less than $5 \times 10^{-4}$ Ω·cm, and the current conducting efficiency is further facilitated.

According to an embodiment of the disclosure, the area in which the orthogonal projection of the first ohmic contact layer 121 on the plane on which the first type semiconductor layer 101 is located is overlapped with the orthogonal projection of the first pad 111 on the plane on which the first type semiconductor layer 101 is located is less than or equal to 50% of the area of the orthogonal projection of the first ohmic contact layer 121. In the case where the overlapping area is greater than 50%, the first ohmic contact layer 121 and the first pad 111 are excessively overlapped with each other. As a result, the setting degree of freedom is reduced. Here, the orthogonal projection of the first ohmic contact layer 121 on the plane on which the first type semiconductor layer 101 is located is not overlapped with the orthogonal projection of the first pad 111 on the plane on which the first type semiconductor layer 101 is located. Thus, the degree of freedom for setting the position of the first pad 111 is increased.

According to an embodiment of the disclosure, the area in which the orthogonal projection of the current conducting layer 131 on the plane on which the first type semiconductor layer 101 is located is overlapped with the orthogonal projection of the first pad 111 on the plane on which the first type semiconductor layer 101 is located is less than or equal to 50% of the area of the orthogonal projection of the current conducting layer 131. The first pad 111 may exhibit a favorable conducting efficiency through the current conducting layer 131. The size of the first pad 11 which absorbs light does not need to be large. By subsequently bonding the micro LED 1 to a display back plate (not shown), the light transmission rate may be further increased, and the micro LED 1 is applicable to a micro LED transparent display.

To more comprehensively describe the various embodiments of the disclosure, several other embodiments of the disclosure will be described in the following. It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2:
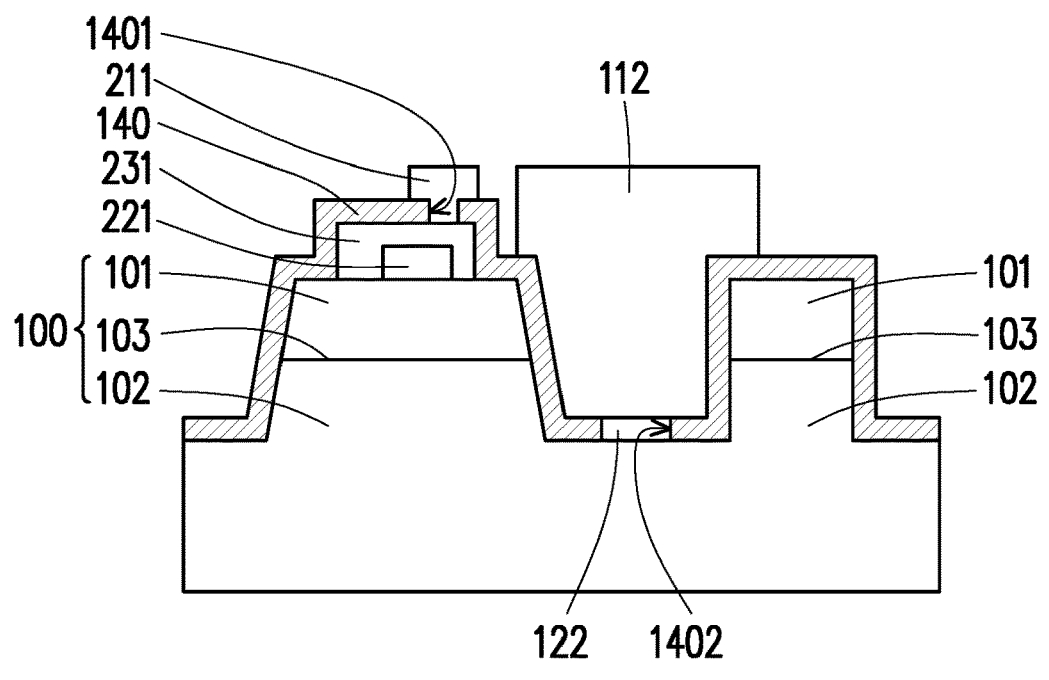

Referring to FIG. 2, FIG. 2 illustrates a micro light-emitting diode (LED) according to a second embodiment of the disclosure. A micro LED 2 includes the epitaxy structure 100, a first pad 211, the second pad 112, a first ohmic contact layer 221, the second ohmic contact layer 122, and a current conducting layer 231, and the insulating layer 140. The difference of the embodiment from the embodiment shown in FIG. 1 is described in the following.

In the embodiment shown in FIG. 2, the distance between the first pad 211 and the second pad 112 is close. Therefore, when the micro LED 2 is to be bonded to a display back plate (not shown) subsequently, the aperture ratio of the display is increased, as the first pad 211 and the second pad 112 that absorb light are densely arranged. In addition, since the first pad 211 and the second pad 112 are close to the center, the bonding stability in the subsequent bonding to the display back plate is ensured, and a defect in the vulnerable epitaxy structure within the micro LED 2 is avoided.

Figure 3:
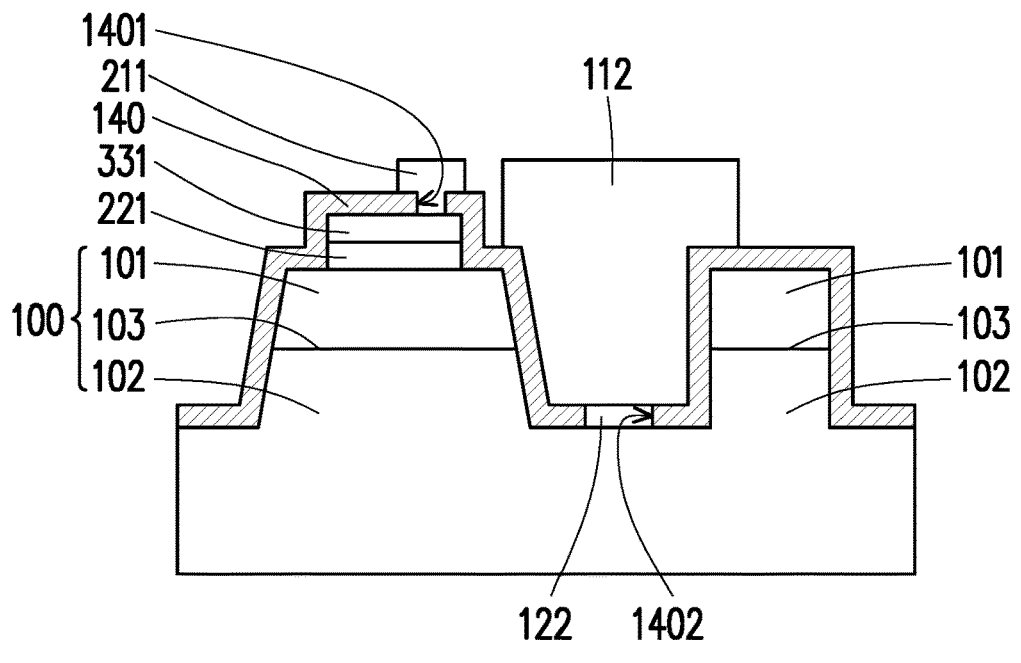

Referring to FIG. 3, FIG. 3 illustrates a micro light-emitting diode (LED) according to a third embodiment of the disclosure. A micro LED 3 includes the epitaxy structure 100, the first pad 211, the second pad 112, the first ohmic contact layer 221, the second ohmic contact layer 122, a current conducting layer 331, and the insulating layer 140. The difference of the embodiment from the embodiment shown in FIG. 1 is described in the following.

In the embodiment shown in FIG. 3, the orthogonal projection of the first pad 211 on the plane on which the first type semiconductor layer 101 is located is located between the orthogonal projection of the second pad 112 and the orthogonal projection of the first ohmic contact layer 221. The current conducting layer 331 is away from the first type semiconductor layer 101. By doing so, the first type semiconductor layer 101 may be prevented from being damaged during the manufacture of the current conducting layer 331.

Figure 4:
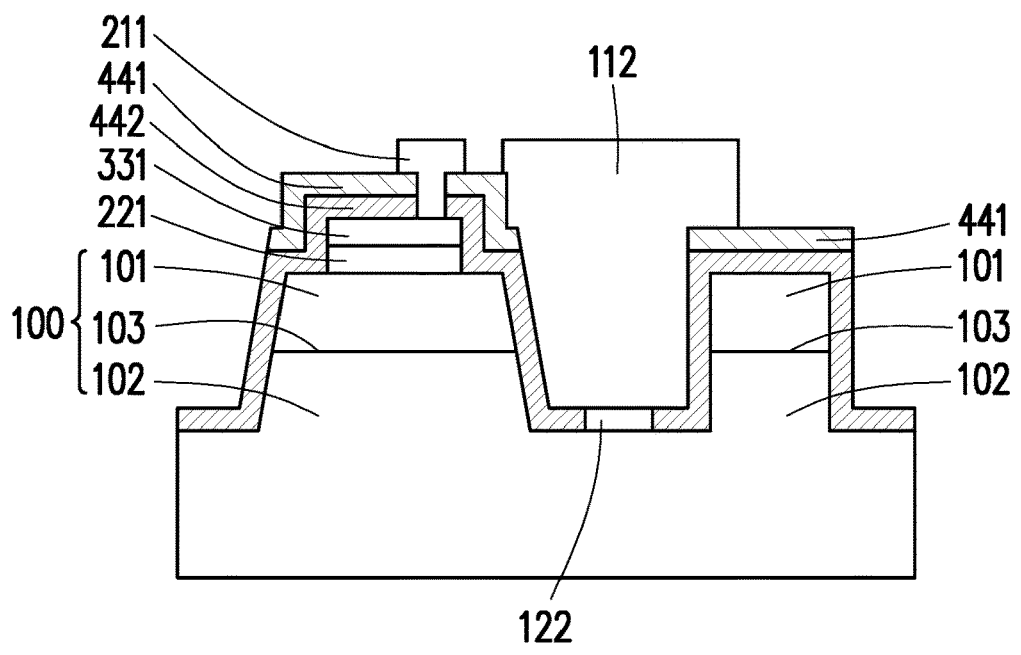

Referring to FIG. 4, FIG. 4 illustrates a micro light-emitting diode (LED) according to a fourth embodiment of the disclosure. A micro LED 4 includes the epitaxy structure 100, the first pad 211, the second pad 112, the first ohmic contact layer 221, the second ohmic contact layer 122, the current conducting layer 331, an insulating layer 441, and an insulating layer 442. The insulating layer 441 is disposed between the first pad 211 and the insulating layer 442. The current conducting layer 331 is disposed between portions of the insulating layer 442. The difference of the embodiment from the embodiment shown in FIG. 3 is described in the following.

In the embodiment shown in FIG. 4, the materials of the insulating layers 441 and 442 may be different. The material of the insulating layer 442 may include, for example, at least one of silicon dioxide ($SiO_2$), aluminum nitride (AlN), and silicon nitride (SiN). The insulating layer 442 may serve as a passivation layer to reduce the chance of electron-hole combination on the sidewall of the active layer and facilitate the light-emitting efficiency of the micro LED 4.

The insulating layer 441 may be a distributed Bragg reflector formed by stacking materials such as $SiO_2$, AlN, and SiN, etc., and serve as a light reflective layer. The light reflectivity of the insulating layer 441 is greater than or equal to the light reflectivity of the insulating layer 442, thereby facilitating forward light emission. According to an embodiment of the disclosure, the insulating layer 441 is a distributed Bragg reflector. According to an embodiment of the disclosure, the Young's modulus of the insulating layer 441 may be greater than or equal to the Young's modulus of the insulating layer 442. Thus, the insulating layer 441 may take the pressure of bonding to the display back plate and provide protection when the micro LED 4 is to be bonded to the display back plate subsequently.

In the embodiment, the area in which the orthogonal projection of the active layer 103 on the plane on which the first type semiconductor layer 101 is located is overlapped with the orthogonal projection of the first pad 211 is less than or equal to 50% of the area of the orthogonal projection of the active layer 103. As a consequence, the proportion of the light emitted by the active layer 103 and absorbed by the first pad 211 is reduced.

Figure 5:
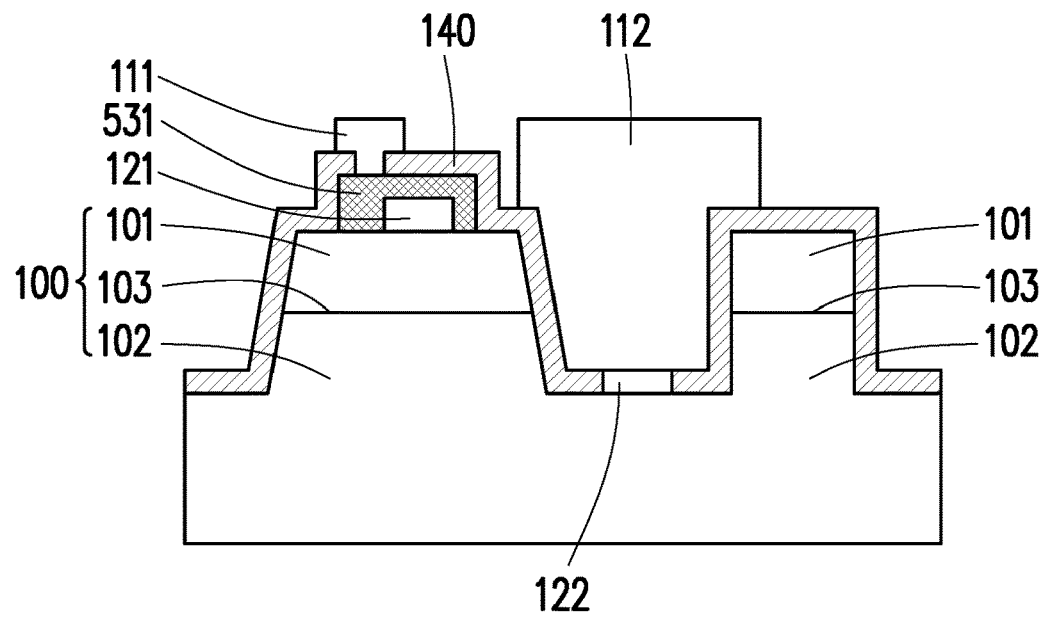

Referring to FIG. 5, FIG. 5 illustrates a micro light-emitting diode (LED) according to a second embodiment of the disclosure. A micro LED 5 includes the epitaxy structure 100, the first pad 111, the second pad 112, the first ohmic contact layer 121, the second ohmic contact layer 122, a current conducting layer 531, and the insulating layer 140. The difference of the embodiment from the embodiment shown in FIG. 1 is described in the following.

In the embodiment, the current conducting layer 531 is metal. By using the low-resistance property of metal, a carrier may exhibit a favorable transverse conduction efficiency, thereby reducing a forward voltage. In addition, the current conducting layer 531 made of metal may further serve as a reflection mirror to facilitate the reflectivity of the light emitted by the active layer 103.

In the embodiment, the area of the orthogonal projection of the current conducting layer 531 on the plane on which the first type semiconductor layer 101 is located is greater than the area of the orthogonal projection of the first pad 111. In addition, the area of the orthogonal projection of the first pad 111 is greater than the area of the orthogonal projection of the first ohmic contact layer 121. Specifically, compared with the conventional art, the micro LED 5 of the embodiment of the disclosure is provided with the current conducting layer 531. Since the area of the orthogonal projection provided by the current conducting layer 531 is greater than the area of the orthogonal projection provided by the first ohmic contact layer 121, the area of the orthogonal projection of the first pad 111 is increased. In other words, the bonding surface of the first pad 111 for bonding to the display back plate in a subsequent process is increased. As a result, the yield of the subsequent bonding process is increased.

Figure 6:
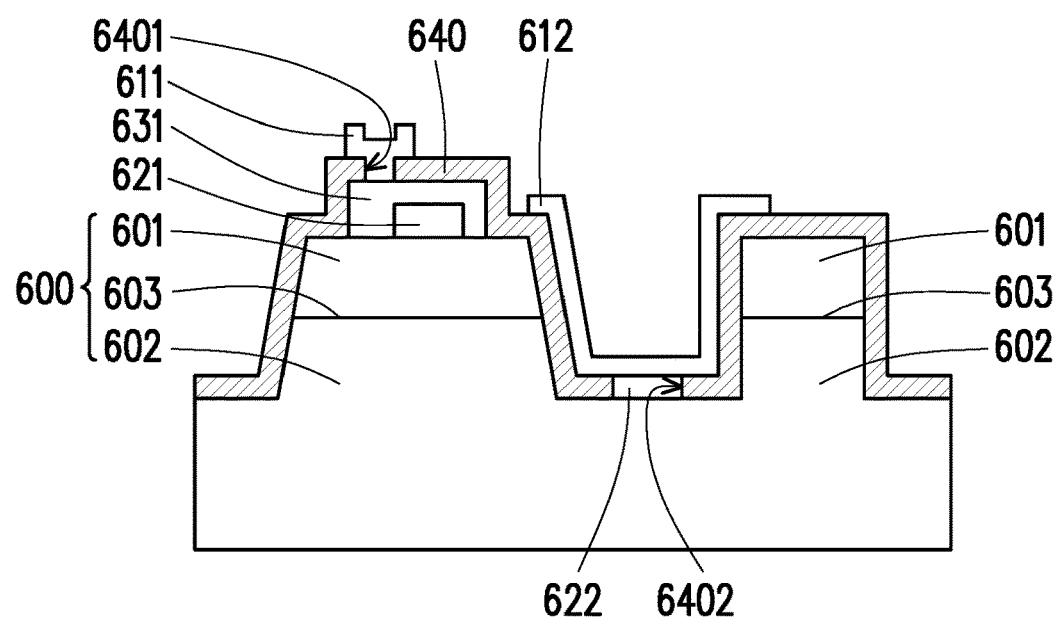

Referring to FIG. 6, FIG. 6 illustrates a micro light-emitting diode (LED) according to a sixth embodiment of the disclosure. A micro LED 6 includes an epitaxy structure 600, a first pad 611, a first ohmic contact layer 621, a current conducting layer 631, an insulating layer 640, a second pad 612, and a second ohmic contact layer 622. The epitaxy structure 600 includes a first type semiconductor layer 601, a second type semiconductor layer 602, and an active layer 603 disposed between the first type semiconductor layer 601 and the second type semiconductor layer 602. The first pad 611 is electrically connected to the first type semiconductor layer 601. The first ohmic contact layer 621 is electrically connected between the first type semiconductor layer 601 and the first pad 611. The current conducting layer 631 is electrically connected between the first ohmic contact layer 621 and the first pad 611. The orthogonal projection of the first ohmic contact layer 621 on the plane on which the first type semiconductor layer 601 is located and the orthogonal projection of the first pad 611 on the plane on which the first type semiconductor layer 601 is located are misaligned with each other. The current conducting layer 631 is disposed between the first ohmic contact layer 621 and the insulating layer 640. The first pad 611 is connected to the current conducting layer 631 via a first through hole 6401 of the insulating layer 640 to be electrically connected to the first ohmic contact layer 621 and the first type semiconductor layer 601. The second pad 612 is connected to the second ohmic contact layer 622 disposed in a second through hole 6402 of the insulating layer 640 to be electrically connected to the second type semiconductor layer 602.

In the embodiment, the first pad 611 and the second pad 612 are each provided with a recess. The recesses may serve as spaces for accommodating bonding solders (not shown) on the display back plate (not shown) when the micro LED 6 is to be bonded to the display back plate subsequently, thereby preventing overflow from affecting the bonding yield. According to an embodiment of the disclosure, the first pad 611 and the second pad 612 may be at the same height to balance the bonding pressure.

Figure 7:
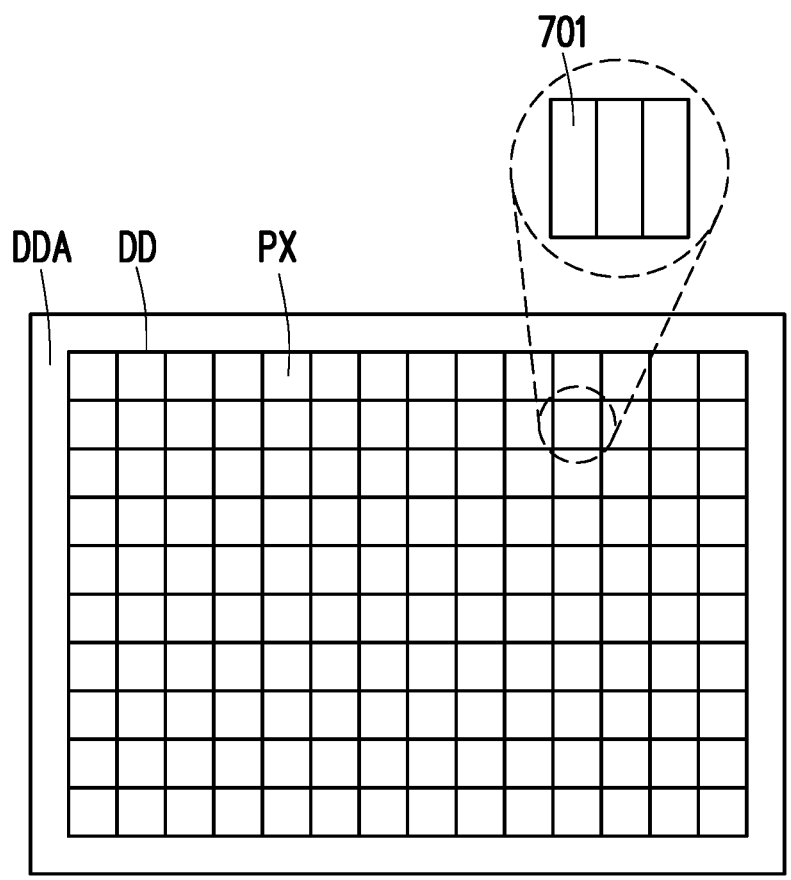
FIG. 7 is a schematic top view illustrating a display panel according to an embodiment of the disclosure.

Referring to FIG. 7, FIG. 7 illustrates a display panel according to an embodiment of the disclosure. The display panel 7 includes a display region DD and a non-display region DDA. The display region DD includes a plurality of pixel units PX arranged into an array. Each pixel unit PX includes at least one micro LED 701. The micro LED 701 may be realized based on a micro LED according to any one of the first to sixth embodiments of the disclosure.

Based on the above, compared with the conventional art, the micro LED according to the embodiments of the disclosure is provided with the current conducting layer. The current conducting layer is electrically connected between the first ohmic contact layer and the first pad. Thus, the first ohmic contact layer is not required to be disposed directly under the first pad. When the insulating layer is etched to generate the first through hole, the current conducting layer may serve as an etching protection layer of the first ohmic contact layer. Accordingly, the first ohmic contact layer of the micro LED is prevented from being damaged in the manufacturing process. Hence, the contact resistance value may be reduced, and the light-emitting efficiency of the micro LED may be facilitated. In addition, since the first pad and the first ohmic contact layer are misaligned with each other (i.e., the first ohmic contact layer is not required to be disposed directly under the first pad), the position where the first ohmic contact layer is disposed is not limited by the size and the position of the first pad, and the degree of freedom for setting the position of the first ohmic contact layer is increased. Therefore, the first ohmic contact layer may be disposed at a position away from the sidewall of the active layer, so as to reduce the chance of electron-hole combination on the sidewall of the active layer. Moreover, since the degree of freedom for setting the position of the first ohmic contact layer is increased, a suitable setting position may be chosen. As a result, the distance between the first ohmic contact layer and the second ohmic contact layer is reduced, and a forward bias is consequently reduced.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A micro light-emitting diode (LED), comprising:
   an epitaxy structure, comprising:
      a first type semiconductor layer;
      a second type semiconductor layer; and
      an active layer, disposed between the first type semiconductor layer and the second type semiconductor layer;
   a first pad, electrically connected to the first type semiconductor layer;
   a first ohmic contact layer, electrically connected to the first type semiconductor layer and the first pad; and
   a current conducting layer, electrically connected between the first ohmic contact layer and the first pad,
   wherein from a cross-sectional view, the first pad and the first ohmic contact layer are misaligned in a direction parallel to a plane on which the first type semiconductor layer is located, and wherein the current conducting layer encapsulates from a top surface to a side surface of the first ohmic contact layer, and extends to directly contact the first type semiconductor layer.

2. The micro LED as claimed in claim 1, wherein an area in which an orthogonal projection of the first ohmic contact layer on the plane on which the first type semiconductor layer is located is overlapped with an orthogonal projection of the first pad on the plane is less than or equal to 50% of an area of the orthogonal projection of the first ohmic contact layer.

3. The micro LED as claimed in claim 1, wherein an area in which an orthogonal projection of the current conducting layer on the plane on which the first type semiconductor layer is located is overlapped with an orthogonal projection of the first pad on the plane is less than or equal to 50% of an area of the orthogonal projection of the current conducting layer.

4. The micro LED as claimed in claim 1, further comprising a first insulating layer, wherein the current conducting layer is disposed between the first ohmic contact layer and the first insulating layer, and the first pad is connected to the current conducting layer via a first through hole of the first insulating layer.

5. The micro LED as claimed in claim 4, further comprising a second insulating layer disposed between the first insulating layer and the first pad, wherein the current conducting layer is disposed between portions of the first insulating layer.

6. The micro LED as claimed in claim 5, wherein a light reflectivity of the second insulating layer is greater than or equal to a light reflectivity of the first insulating layer.

7. The micro LED as claimed in claim 5, wherein a Young's modulus of the second insulating layer is greater than or equal to a Young's modulus of the first insulating layer.

8. The micro LED as claimed in claim 1, wherein an area in which an orthogonal projection of the active layer on the plane on which the first type semiconductor layer is located is overlapped with an orthogonal projection of the first pad on the plane is less than or equal to 50% of an area of the orthogonal projection of the active layer.

9. The micro LED as claimed in claim 1, wherein the current conducting layer is away from the first type semiconductor layer.

10. The micro LED as claimed in claim 9, wherein an area of an orthogonal projection of the current conducting layer on the plane on which the first type semiconductor layer is located is greater than an area of an orthogonal projection of the first pad on the plane, and the area of the orthogonal projection of the first pad is greater than an area of an orthogonal projection of the first ohmic contact layer on the plane.

11. The micro LED as claimed in claim 1, wherein an area of an orthogonal projection of the current conducting layer on the plane on which the first type semiconductor layer is located is greater than an area of an orthogonal projection of the first pad on the plane, and the area of the orthogonal projection of the first pad is greater than an area of an orthogonal projection of the first ohmic contact layer on the plane.

12. The micro LED as claimed in claim 1, further comprising a second pad electrically connected to the second type semiconductor layer, wherein an orthogonal projection of the first ohmic contact layer on the plane is located between an orthogonal projection of the second pad on the plane on which the first type semiconductor layer is located and an orthogonal projection of the first pad on the plane.

13. The micro LED as claimed in claim 1, further comprising a second pad electrically connected to the second type semiconductor layer, wherein an orthogonal projection of the first pad on the plane is located between an orthogonal projection of the second pad on the plane on which the first type semiconductor layer is located and an orthogonal projection of the first ohmic contact layer on the plane.

14. A display panel, comprising a plurality of pixel units arranged into an array, wherein each of the pixel units comprises the micro LED as claimed in claim 1.

* * * * *